United States Patent [19]

Ikemizu

[11] Patent Number: 4,577,923
[45] Date of Patent: Mar. 25, 1986

[54] MICROWAVE INTEGRATED CIRCUIT AND MOUNTING DEVICE THEREFOR

[75] Inventor: Hiroshi Ikemizu, Tokyo, Japan
[73] Assignee: NEC Corporation, Japan
[21] Appl. No.: 593,614
[22] Filed: Mar. 26, 1984

[30] Foreign Application Priority Data

Mar. 24, 1983 [JP] Japan ............... 58-42241[U]
Mar. 24, 1983 [JP] Japan ............... 58-42242[U]

[51] Int. Cl.⁴ .................................. H01R 4/02
[52] U.S. Cl. ................. 339/275 B; 339/17 CF
[58] Field of Search ........... 339/17 CF, 275 B, 17 C; 174/52 FP; 357/74, 80; 228/39, 215, 180.1, 180.2

[56] References Cited

U.S. PATENT DOCUMENTS

| | | | |
|---|---|---|---|
| 3,189,536 | 5/1965 | Vincent | 339/17 C |
| 3,331,912 | 7/1967 | Stricker et al. | 174/52 FP X |
| 3,621,112 | 11/1971 | Stickley et al. | 174/52 FP X |
| 3,889,232 | 8/1975 | Berg | 339/17 C |
| 4,070,077 | 1/1978 | Clark | 339/17 C |
| 4,181,385 | 1/1980 | DeSantis et al. | 339/17 C |

*Primary Examiner*—Eugene F. Desmond
*Attorney, Agent, or Firm*—Ostrolenk, Faber, Gerb & Soffen

[57] ABSTRACT

A microwave integrated circuit includes a mounting device surrounding a lead adapted to be electrically connected to a circuit board. The mounting device comprises electrically conductive material spaced from the lead to form a coaxial structure suitable for microwave operation. Apertures, grooves, or the like extend from the space defined between the mounting device and the lead to the outside of the mounting device to provide an exit for a flux gas evolved during soldering of the microwave integrated circuit to a circuit board. The mounting device may exist separately from the microwave integrated circuit.

7 Claims, 10 Drawing Figures

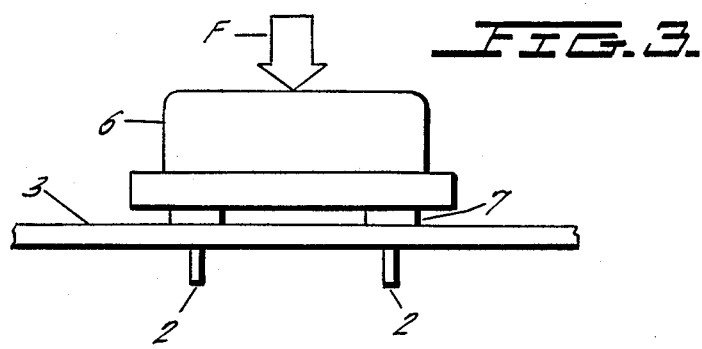
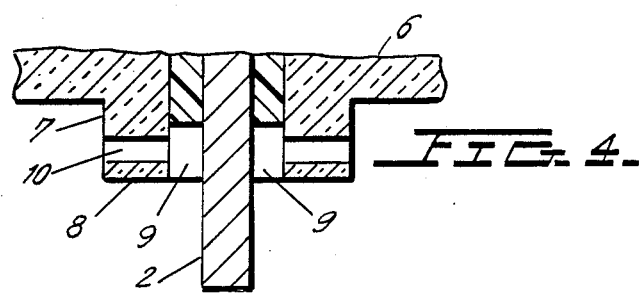
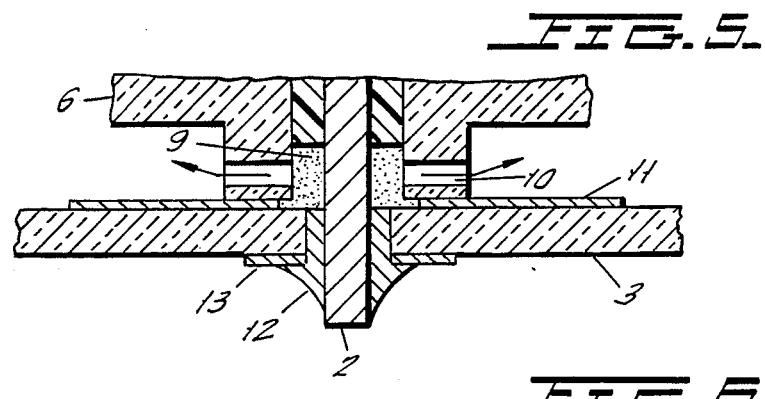
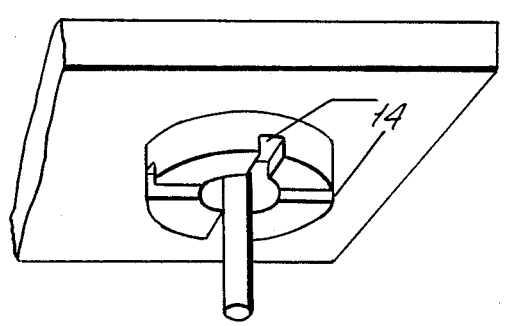

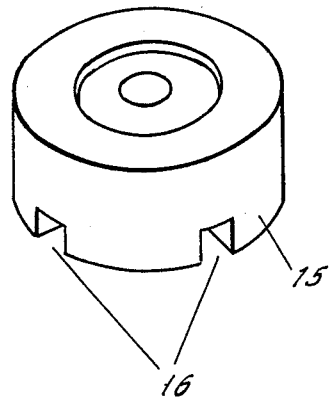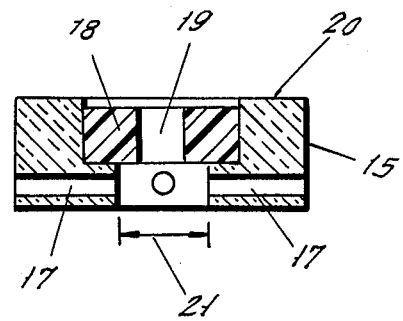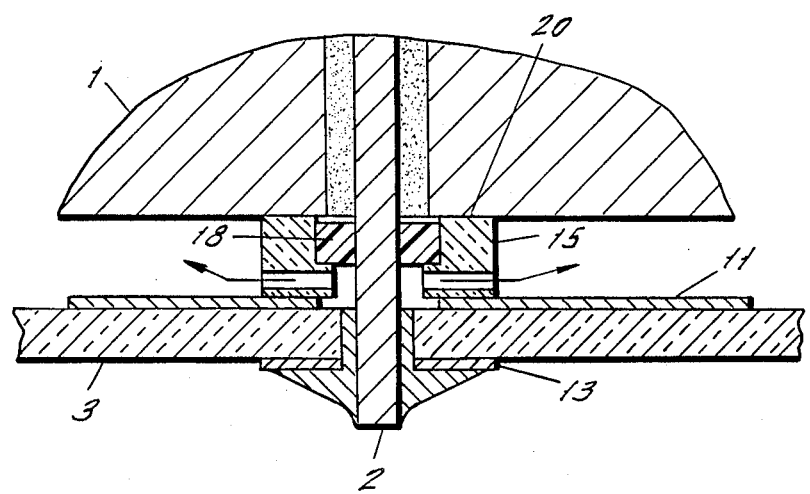

MICROWAVE INTEGRATED CIRCUIT AND MOUNTING DEVICE THEREFOR

BACKGROUND OF THE INVENTION

The present invention relates to a microwave integrated circuit and a device for mounting the microwave integrated circuit on a printed circuit board.

In recent years, a microwave apparatus has been assembled by using a packaged microwave integrated circuit (abbreviated herein to as "MIC"), i.e., by mounting the MIC on a printed circuit board. In this case, it is known in the art that not only solder connection between a lead of the MIC and the circuit pattern of the printed circuit board, but also contact between the body of the MIC and a ground pattern of the printed circuit board, will exert a serious influence upon an efficiency or a electrical characteristic of the microwave apparatus. When mounting of the MIC is done manually on the printed circuit board, it is possible to confirm the solder connection between the lead of the MIC and the circuit patterns, and the contact between the MIC body and the ground pattern of the printed circuit board during assembling work. But this requires great time-consumption. On the other hand, when a mass-produced microwave apparatus, i.e., a consumer type is produced, it is soldered by an automatic solderer. Therefore, it is hardly possible to individually check the solder connection between the lead and the circuit pattern, and the contact between the MIC body and the the ground pattern. In a prior-art microwave apparatus including a MIC, therefore, inferior solder connection or contact and deterioration in a electrical characteristic unavoidably occur due to the automatic soldering process, so that the microwave apparatus including the MIC having a good performance cannot be produced.

SUMMARY OF THE INVENTION

It is, therefore, an object of the present invention to provide a microwave integrated circuit (MIC) with which it is possible to ensure connection between a lead of a MIC and the circuit pattern of a printed circuit board, and contact between the body of the MIC and the ground pattern of the printed circuit board, even when an automatic solderer is used.

Another object of the present invention is to provide a microwave integrated circuit mounting device which can mount a microwave integrated circuit on a printed circuit board without fail, even when an automatic solderer is used.

According to one feature of the present invention, there is provided a microwave integrated circuit in which a partial body around each lead is protruded and the protruded portion is equipped with degasifying means.

According to another feature of the present invention, there is provided a microwave integrated circuit mounting device which comprises: a conductor block to be sandwiched between a printed circuit board and a microwave integrated circuit and which has a hole allowing to guide a lead of the microwave integrated circuit therethrough; an insulating member (or a dielectric member) embedded in the hole at the side in contact with the microwave integrated circuit to enclose the lead; and degasifying means provided in the hole and at the side in contact with the printed circuit board.

BRIEF DESCRIPTION OF THE DRAWINGS

FIG. 3 shows a view of a first embodiment of the present invention, which is mounted on a printed circuit board;

FIG. 4 shows a detailed sectional view of the mount portion of the microwave integrated circuit shown in FIG. 2;

FIG. 5 is another sectional view in which the mount portion shown in FIG. 3 is soldered to the printed circuit board;

FIG. 6 shows a modification of the first embodiment of the present invention;

FIG. 7 shows a perspective view of a second embodiment of the present invention;

FIG. 8 shows a sectional view of a modification of the second embodiment of the present invention; and FIG. 9 shows a sectional view in which the microwave integrated circuit shown in FIG. 8 is mounted on the printed circuit board.

DESCRIPTION OF THE PRIOR ART STATEMENTS

Figure 1:
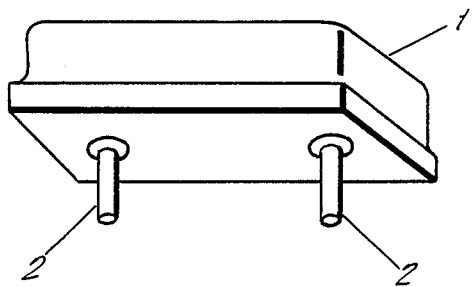
FIG. 1 shows a schematic view of a microwave integrated circuit according to a prior art.
Figure 2A:
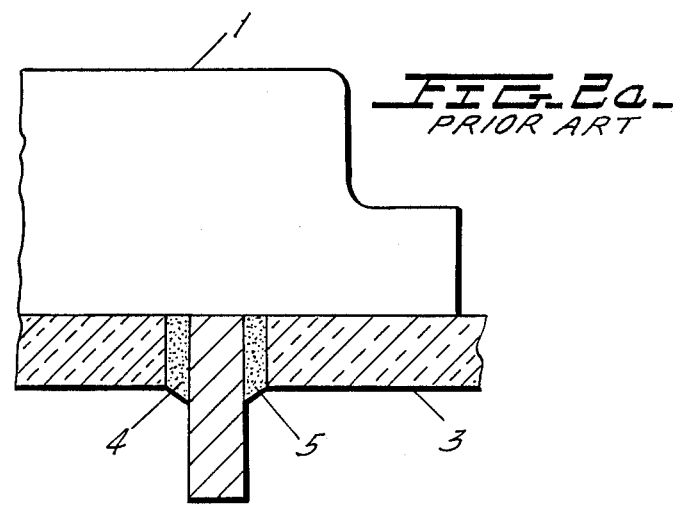
FIGS. 2(a) and 2(b) are sectional views showing the operation of mounting the microwave integrated circuit shown in FIG. 1.
Figure 2B:
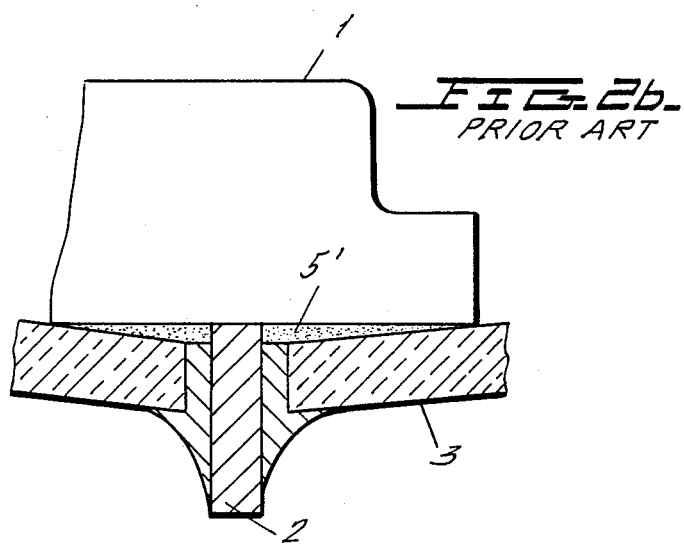

Before explaining the present invention, a cursory review of the prior art will be made with reference to FIGS. 1, 2(a) and 2(b). When a prior art microwave integrated circuit (MIC) 1 shown in FIG. 1 having a plurality of leads 2 at its back face, is mounted on a printed circuit board by an automatic solderer, a portion to be soldered is first immersed in a flux bath. As a result, a flux 5 remains in a lead hole 4 of the circuit board 3 as shown in FIG. 2(a). After that, when the portion being soldered is dipped in a molten solder bath, the lead hole 4 is filled with the solder. In this case, however, the remaining gaseous flux 5 can not escape and is compressed in the lead holes 4. The flux thus trapped cannot be rinsed out after soldering. Further, the compressed gaseous flux either penetrates the solder just before its solidification to cause pin holes in the solder, or remains as trapped flux 5' between the back face of the MIC 1 and the circuit board 3, as shown in FIG. 2(b). In the former case, the reliability of the solder is markedly reduced, whereas in the latter a characteristic of the apparatus containing the MIC is affected by the gap formed by the trapped flux 5'. Even worse, this flux 5' between the back face of the MIC 1 and the circuit board 3 becomes to corrode the MIC 1 and the circuit board 3 over the years, and, therefore, the function of the apparatus is finally lost.

DESCRIPTION OF THE PREFERRED EMBODIMENTS

Referring to FIG. 3, a microwave integrated circuit (MIC) 6 according to the present invention is mounted on a printed circuit board 3. As shown in FIG. 3, a mount portion 7 is protruded from the back face of an MIC 6. When the MIC 6 is mounted, a downward pressure F is generally applied by, for example, a spring mechanism or a screw mechanism (not shown). In the present invention, since the contact area, i.e., the area corresponding to the protruded mount portion 7 is more limited than a whole back face of the prior art MIC, the close contact can be made between the mount portion of the MIC and the printed circuit board. Referring to FIG. 4 showing the sectional view of the mount portion 7 of FIG. 3 in detail, the mount portion 7 is protruded around the leads 2 by a predetermined width, and a space 9 is left around each lead 2 in the vicinity of a tip face 8. Gas vent holes 10 are also formed at the tip portion of the protruded mount portion 7 between the space 9 and the outside.

The soldering process for the MIC according to the invention will now be described with reference to FIG. 5. The MIC 6 mounted on the printed circuit board 3 is first immersed in a flux bath while held in contact with the ground pattern 11 of the circuit board 3. The flux flows around the leads 2 and remains in the space 9. After that, the MIC 6 with the printed circuit board 3 is dipped into a solder bath so that solder 12 flows around the leads 2, and the connection between the lead 2 and a circuit pattern 13 is settled as shown in FIG. 5. During this process, the gaseous flux within the spaces 9 is released to the outside through the holes 10, as indicated by arrows, so that it can never enter between the tip face 8 of the protruded portion and the ground pattern 11 on the printed circuit board and never affect them, as it does in the prior art. Furthermore, the remaining flux in the space 9 can also be completely removed by a rinsing process after the soldering, because of the provision of the holes 10, so that the lead 2, the printed circuit 3 and the ground pattern 11 are not corroded. In a modification shown in FIG. 6, the shape of the gas vent holes of the previous embodiment shown in FIG. 4 is changed to grooves 14, but these provide operational effects similar to those of the previous embodiment.

In the forementioned embodiments, the microwave integrated circuit (MIC) is formed to have the protruded portion surrounding the lead. Next, another embodiment, in which an automatic solderer can be also used when a microwave integrated circuit in not provided with such improvement in the forementioned embodiment, i.e., the prior art MIC as shown in FIG. 1 is applied, will be described hereinafter. This embodiment is directed to a mounting device which is to be sandwiched between the MIC and the printed circuit board. Referring to FIG. 7, a mounting device 15 is formed as a short cylinder which has gas vent grooves 16 on its back tip. FIG. 8 is a sectional view of a modification thereof in which the gas vent grooves 16 of FIG. 7 are replaced by gas vent holes 17, as will be described hereinafter. Referring to FIG. 8, an upper part of the device 15 is hollowed out to form a hole in which an insulating (or dielectric) member 18 is embedded. Further, a hole 19 is penetrated through the member 18 to guide a lead of an MIC. The diameter and material of the insulating member 18 are selected according to a predetermined output impedance of the MIC. The upper face of the embedded insulating member 18 is set at a slightly lower level than the upper face 20 of the device 15. The lower part of the device 15 is provided with another hole 21 connected to the hole 19. In the hole 21, the lead of the MIC penetrates with a certain gap. Four gas vent holes 17 are formed radially between the hole 21 and the outside.

As shown in FIG. 9, a lead 2 of a MIC 1 is soldered on the printed circuit board 3 through the mounting device 15 shown in FIG. 8 when soldering is done. In this case, the operational effects obtained through the soldering process are similar to those of the embodiment shown in FIG. 5. The pressure applied downward to the MIC 1 is concentrated on the mounting device 15 so that close contact can be achieved. As a result, any irregularity in the production of the MIC does not cause a deterioration of its electrical characteristic, so that the industrial advantage of the present invention is more effective.

As has been described hereinbefore, the present invention can provide a microwave integrated circuit, or a mounting device therefor, which can ensure accurate connection between the lead of the MIC and a circuit pattern, close contact between the body of the MIC and a ground pattern, and good microwave chracteristics, even if it is mounted by an automatic solderer.

What is claimed is:

1. A microwave integrated circuit having at least one lead extending therefrom, said microwave integrated circuit comprising:
    a protrusive portion being coaxial with and arranged around said lead that an axially extending space is defined between said lead and an inside surface of said protrusive portion, said protrusive portion being formed of an electrically conductive material; and
    degasifying means extending from said space to an area external of said protrusive portion.

2. A microwave integrated circuit as claimed in claim 1, wherein said degasifying means comprises apertures extending between said space and the outside of said protrusive portion.

3. A microwave integrated circuit as claimed in claim 1, wherein said degasifying means comprises grooves situated at the tip of said protrusive portion.

4. A microwave integrated circuit mounting device adapted to be situated between a microwave integrated circuit having at least one lead and a circuit board, said mounting device comprising:
    a body section of electrically conductive material, said body section including an aperture with a generally cylindrical surface and being dimensioned so that an elongated lead may extend therethrough while being coaxially spaced from said generally cylindrical surface; and
    degasifying means extending from said aperture to an area external to said mounting device.

5. A microwave integrated circuit mounting device as claimed in claim 4, further comprising insulating material in the circumferential periphery of said aperture.

6. A microwave integrated circuit mounting device as claimed in claim 4, wherein said mounting device is configured so as to be able to be mounted on a major surface of the circuit board.

7. A microwave integrated circuit mounting device as claimed in claim 4, wherein said degasifying means is situated at the tip of said mounting device.

* * * * *